United States Patent
Leng et al.

(10) Patent No.: US 10,418,437 B1
(45) Date of Patent: Sep. 17, 2019

(54) FLEXIBLE DISPLAY PANEL

(71) Applicant: Shanghai Tianma Micro-Electronics Co., Ltd., Shanghai (CN)

(72) Inventors: Chuanli Leng, Shanghai (CN); Wenxin Jiang, Shanghai (CN)

(73) Assignee: SHANGHAI TIANMA MICRO-ELECTRONICS CO., LTD., Shanghai (CN)

(*) Notice: Subject to any disclaimer, the term of this patent is extended or adjusted under 35 U.S.C. 154(b) by 0 days.

(21) Appl. No.: 15/992,372

(22) Filed: May 30, 2018

(30) Foreign Application Priority Data

Mar. 1, 2018 (CN) .......................... 2018 1 0173252

(51) Int. Cl.
*H01L 51/00* (2006.01)
*H01L 27/32* (2006.01)
*G06F 3/041* (2006.01)

(52) U.S. Cl.
CPC ........ *H01L 27/3279* (2013.01); *H01L 27/323* (2013.01); *H01L 27/3276* (2013.01); *H01L 51/0097* (2013.01); *G06F 3/0412* (2013.01); *G06F 2203/04102* (2013.01); *H01L 2251/5338* (2013.01); *H01L 2251/5392* (2013.01)

(58) Field of Classification Search
CPC ..................................................... H01L 27/30
See application file for complete search history.

(56) References Cited

U.S. PATENT DOCUMENTS

| | | | |
|---|---|---|---|
| 2017/0277288 A1* | 9/2017 | Choi | ................. G06F 3/041 |
| 2018/0122863 A1* | 5/2018 | Bok | ................ H01L 27/3225 |

FOREIGN PATENT DOCUMENTS

| | | |
|---|---|---|
| CN | 205657057 U | 10/2016 |
| DE | 102016125930 A1 | 7/2017 |
| DE | 102017108600 A1 | 2/2018 |
| DE | 102017128459 A1 | 3/2018 |

* cited by examiner

*Primary Examiner* — Cheung Lee
(74) *Attorney, Agent, or Firm* — Tarolli, Sundheim, Covell & Tummino LLP

(57) ABSTRACT

The present disclosure provides a flexible display panel including a display area and a non-display area, and a bending area is arranged therebetween. The flexible display panel further includes a flexible substrate and a thin film transistor layer. The thin film transistor layer includes a semi-conductor layer, a gate electrode insulation layer, a gate electrode layer, an insulation interlayer and a source-drain electrode metal layer. The flexible display panel includes a touch layer arranged on one side of the thin film transistor layer away from the flexible substrate. The touch layer includes a first and second touch metal layer. The flexible display panel further includes signal transmission lines including at least two parallel wiring layers in the bending area. Each wiring layer is fabricated in a same layer with at least two of the source-drain electrode metal layer, the first touch metal layer, and the second touch metal layer.

18 Claims, 13 Drawing Sheets

US 10,418,437 B1

FLEXIBLE DISPLAY PANEL

CROSS-REFERENCE TO RELATED APPLICATIONS

The present application claims priority to Chinese Patent Application No. 201810173252.2, filed on Mar. 1, 2018, the content of which is incorporated herein by reference in its entirety.

TECHNICAL FIELD

The present disclosure relates to the technical field of display technologies, and particularly, relates to a flexible display panel.

BACKGROUND

With the development of science and technology, portable devices have emerged as a new trend in modern society and are changing human life gradually, bringing significant changes in science and technology. Especially, flexible display panels become more and more popular among users due to its advantages of bendability, portability and wide applicability. In addition, flexible display panels bring a brand-new visual experience.

In the related technologies, it is common that the metal wires break in the bending area of the flexible display panels, resulting in display defects.

SUMMARY

The present disclosure provides a flexible display panel, which can reduce risk of the metal wiring being broken.

In a first aspect, the present disclosure provides a flexible display panel. The flexible display panel has a display area, a non-display area, and a bending area arranged between the display area and the non-display area. The flexible display panel includes a flexible substrate, and a thin film transistor layer arranged on the flexible substrate. The thin film transistor layer includes a semi-conductor layer, a gate electrode insulation layer, a gate electrode layer, an insulation interlayer and a source-drain electrode metal layer sequentially stacked in a direction away from the flexible substrate. The flexible display panel further includes a touch layer arranged on one side of the thin film transistor layer away from the flexible substrate. The touch layer includes a first touch metal layer and a second touch metal layer. The flexible display panel further includes signal transmission lines including at least two parallel wiring layers in the bending area. Each of the at least two parallel wiring layers is fabricated in a same layer with at least two of the source-drain electrode metal layer, the first touch metal layer, and the second touch metal layer.

In a second aspect, the present disclosure provides a flexible display device. The flexible display device includes the above-mentioned flexible display panel.

The accompanying drawings herein are incorporated into the description as a part of the present disclosure. The accompanying drawings illustrate the embodiments according to the present disclosure and are used to explain the principle of the present disclosure together with the description.

DESCRIPTION OF EMBODIMENTS

The embodiments of the present disclosure are further described in details with reference to the drawings.

It should be noted that, the expressions such as "upper", "lower", "left", "right" and the like mentioned in embodiments of the present disclosure are described with reference to the placement status in the accompanying drawings, and should not be construed as limiting embodiments of the present disclosure. In addition, it should also be understood that, in the context, while referring to an element being formed "above" or "below" another element, it is possible that the element is directly formed "above" or "below" the other element, or it is also possible that the element is formed "above" or "below" the other element via an intermediate element.

Figure 1:
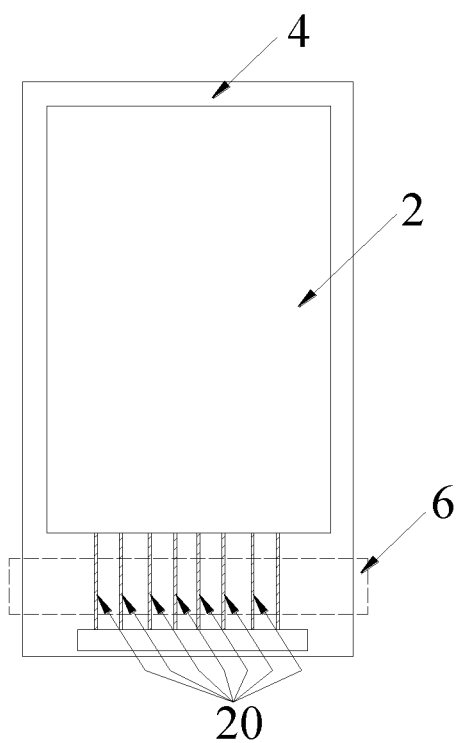
FIG. 1 illustrates a schematic diagram of a flexible display panel according to an embodiment of the present disclosure.

FIG. 1 is a schematic diagram of a flexible display panel according to an embodiment of the present disclosure.

The present disclosure provides a flexible display panel 100, and the flexible display panel 100 includes a display area 2, a non-display area 4 and a bending area 6 arranged between the display area 2 and the non-display area 4. The flexible display panel 100 can be bent in the bending area 6.

In an embodiment, the bending area 6 can be a non-display area that is not used to display images. For example, the bending area 6 can be arranged in an IC (integrated circuit) area or a FPC (Flexible Printed Circuit, flexible circuit board) area and the like. Of course, in other embodiments, the bending area 6 can also be a display area that used for example, to display time, date, and the like.

Figure 2:
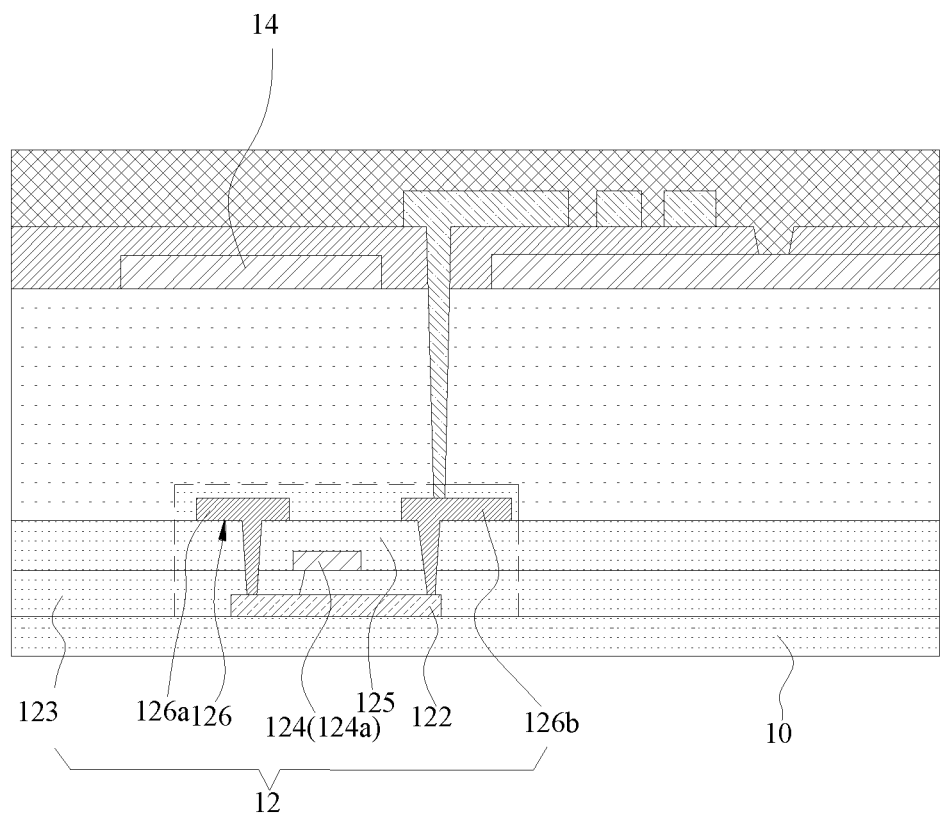
FIG. 2 illustrates a cross-sectional view a flexible display panel according to an embodiment of the present disclosure.

FIG. 2 shows a cross-sectional view of a flexible display panel according to an embodiment of the present disclosure.

The flexible display panel 100 includes a flexible substrate 10 as well as a thin film transistor layer 12 and a touch layer 14 arranged on the flexible substrate 10. The touch layer 14 is arranged on one side of the thin film transistor layer 12 away from the flexible substrate 10.

In the embodiments of the present disclosure, the flexible substrate 10 can include various suitable flexible or bendable organic materials. For example, the flexible substrate 10 can include polymer resins, such as polyethersulfone (PES), polypropylene resin (PP), polyetherimide (PEI), poly (ethylene naphthalate) (PEN), polyethylene terephthalate (PET), polyphenylene sulfide (PPS), polyallyl compounds, polyimide (PI), polycarbonate (PC) and/or cellulose acetate propionate (CAP).

The thin film transistor layer 12 includes a semi-conductor layer 122, a gate electrode insulation layer 123, a gate electrode layer 124, an insulation interlayer 125 and a source-drain electrode metal layer 126 sequentially stacked along a direction away from the flexible substrate 10. The gate electrode layer 124 includes a gate electrode 124a. The source-drain electrode metal layer 126 includes a source electrode 126a and a drain electrode 126b, and both the source electrode 126a and the drain electrode 126b are connected to the semi-conductor layer 122 (also referred to as active layer). In the flexible display panel 100, the source electrode 126a, the drain electrode 126b, the gate electrode and the semi-conductor layer 122 constitute a thin film transistor. The thin film transistor is used to form a pixel driving circuit for driving a light-emitting element to emit light.

The touch layer 14 can be used to realize touch function of the flexible display panel 100. The touch layer 14 can include a first touch metal layer and a second touch metal layer. A touch electrode and a sensing electrode are arranged in the first touch metal layer and the second touch metal layer, respectively, so as to form a mutual-capacitive or self-capacitive mode.

Referring to FIG. 1, the flexible display panel 100 further includes signal transmission lines 20. With respect to the flexible display panel 100, since the signal transmission lines 20 are bent repeatedly, there is a high risk of line breaking in the bending area 6. For this purpose, it is proposed in the present disclosure that signal transmission lines 20 include at least two parallel wiring layers in the bending area 6. That is, two, three or more wiring layers can be provided, and the wiring layers are parallel and used as signal transmission lines. By this configuration, even if crack or breaking occurs in one wiring layer, the crack will not spread to the other wiring layer, so that some wiring layers in the bending area 6 are available for signal transmission, thereby ensuring normal input and output of signals.

In the flexible display panel 100, each of the parallel wiring layers used as signal transmission lines 20 can be fabricated in a same layer with at least two of the source-drain electrode metal layer 126, the first touch metal layer, and the second touch metal layer. The fabricating methods can include but not limited to physical deposition, vacuum evaporation and the like.

In an optional embodiment, the signal transmission lines 20 include two parallel wiring layers. That is, the two wiring layers are parallel arranged and used as signal transmission lines 20. One of the wiring layers can be fabricated in a same layer with the source-drain electrode metal layer 126, while the other wiring layer can be fabricated in a same layer with the first touch metal layer or the second touch metal layer.

All of the source-drain electrode metal layer 126, the first touch metal layer and the second touch metal layer have a three-layered structure of $T_iA_lT_i$. Since an intermediate metal layer $A_l$ is a relatively soft material that has higher flexibility, the source-drain electrode metal layer 126, the first touch metal layer or the second touch metal layer have better bending-resistance property, thus lowering the risk of breaking of the wiring layers.

Figure 3:
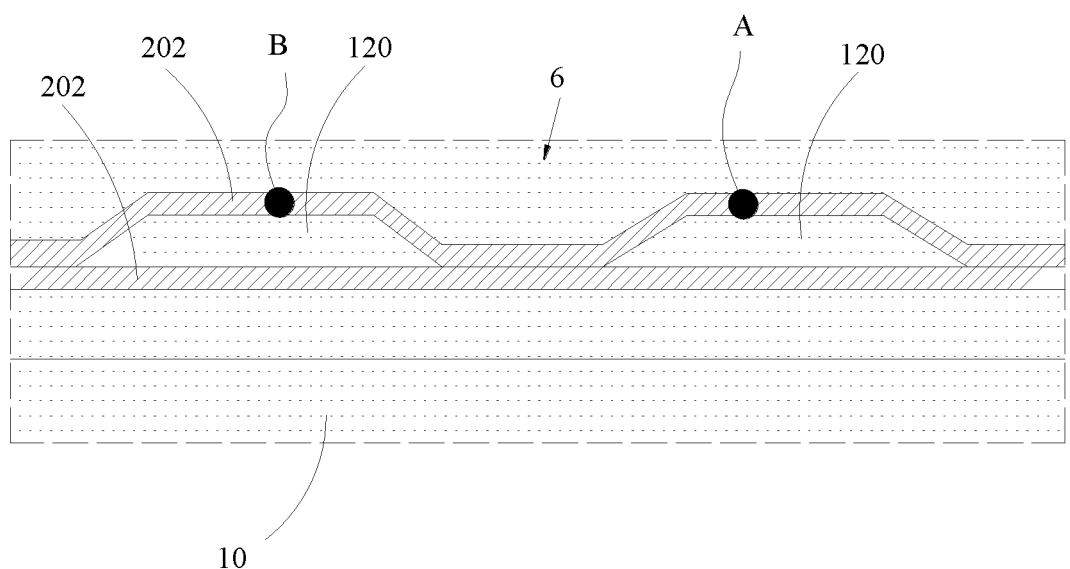
FIG. 3 illustrates a schematic diagram of a connection manner of two conductive layers according to an embodiment of the present disclosure.

FIG. 3 is a schematic diagram of a connection manner of the wiring layers. FIG. 3 illustrates signal transmission lines 20 including two parallel wiring layers 202, but it is not limited to two layers.

The two wiring layers 202 are connected through a through-hole in the bending area 6, and the through-hole can be configured to be a hole having a diameter of 2 μm~8 μm. The insulation layer 120 between the two wiring layers 202 is discontinuous in the bending area 6 due to the through-hole. It is unfavorable to an electrical connection of the two wiring layers, if the through-hole is too small. If the through-hole is too large, it is necessary to widen the wires at the through-hole, which is unfavorable to a wiring design of high-solution Moreover, this would also reduce the distance between adjacent wiring layers, thereby causing short-circuit of the adjacent wiring layers, which is disadvantageous to signal transmission.

In the embodiment as illustrated in FIG. 3, due to the through-hole arranged in the bending area 6, the wiring layers 202 can be connected at the through-hole in the bending area 6. The number of the through-hole can be chosen according to the area of the bending area 6. For example, the number of the through-hole can be one or more. In this way, in the bending area 6 that frequently bent and has highest risk of wire breaking, even if one of the wiring layers 202 is broken at a certain part (for example, section A), other parts of the wiring layers 202 (for example, section B) can still form a parallel structure with the other wiring layer 202, thus reducing the influence of partially broken parts on the whole wiring layers 202.

The two wiring layers 202 are separated by the medium layer 120. The medium layer 120 is an insulation layer. In the manufacturing process of the flexible display panel 100, a portion of the medium layer 120 can be photo-etched through exposure and the like, so as to form the through-hole in the medium layer 120 for connecting the two wiring layers 202.

In an embodiment, the medium layer 120 can be an inorganic layer or an organic layer. In the case where an organic film layer is used as the medium layer 120, the photo-etched medium layer 120 can form a smaller angle, for example smaller than 50°, at the through-hole. Smaller angle allows more convenient arrangement of the upper wiring layer 202, so that a reliable bridge connection between the upper wiring layer 202 and lower wiring layer 202 can be achieved at the through-hole. In an embodiment, the through-hole in the medium layer can be configured to have a slanted side wall. The slanted side wall has a protrusion (not shown) facing away the flexible substrate 10 such that the wiring layer 202 arranged on one side of the medium layer away from the flexible substrate 10 can be readily electrically connected to the other wiring layer 202, avoiding a failure of electrical connection at the through-hole due to the broken circuit caused by a relatively large slope. In addition, when an organic film is used as the medium layer, the organic medium layer can be prepared thicker than the inorganic medium layer due to the better bending performance of the organic medium layer. In this way, signal interference will not occur when the adjacent wiring overlap, thus improving the reliability of signal transmission.

Figure 4:
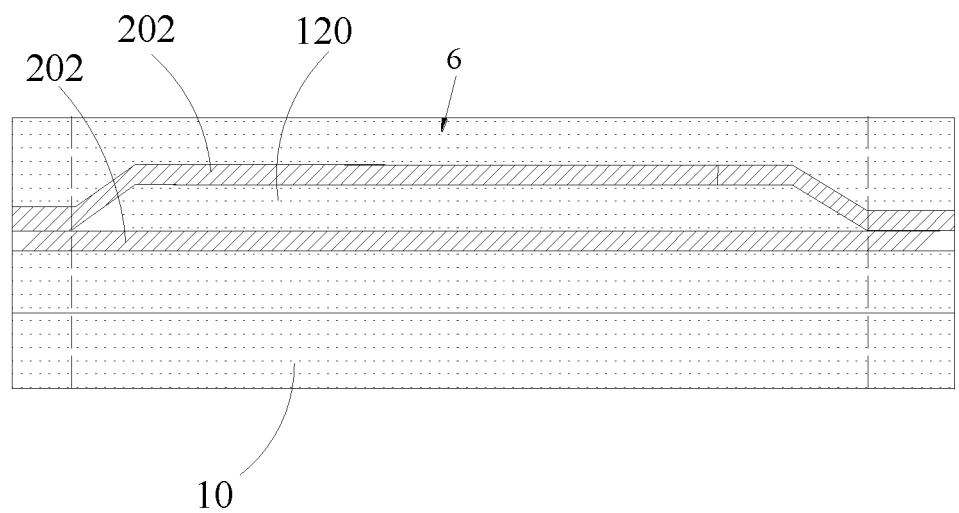
FIG. 4 illustrates a schematic diagram of another connection manner of the two conductive layers according to an embodiment of the present disclosure.

FIG. 4 shows a schematic diagram of another connection manner of parallel wiring layers. In the example shown in FIG. 4, the signal transmission lines 20 include two parallel wiring layers 202, but not limited to two wiring layers.

Both ends of each wiring layer 202 are arranged outside the bending area 6, the portion between the both ends is located in the bending area 6. The two wiring layers 202 are parallel connected through through-holes at the ends, i.e., outside the bending area 6. In this technical solution, the through-holes are arranged in the non-bending area, while the medium layer 120 between the two wiring layers 202 forms a continuous connection in the bending area 6.

The medium layer 120 can be an organic medium layer or an inorganic medium layer, and used as an insulation layer between the two wiring layers 202. In the case where the medium layer 120 is configured to be an organic medium layer, it can play a role in buffering the stress in the wiring layers 202. Therefore, the medium layer 120 continuously distributed in the bending area 6 can exert more remarkable protective effect on the wiring layers 202.

In another aspect, in the embodiment as illustrated in FIG. 4, since there is no need to provide a through-hole in the medium layer 120 in the bending area 6, the medium layer 120 is continuous, thereby simplifying manufacturing process and reducing manufacturing costs. In addition, the two wiring layers 202 are not bent in the non-bending area, so that the risk of wiring layers 202 being broken in the non-bending area is extremely low. Therefore, it is unnecessary to consider whether the two wiring layers 202 can form a parallel connection after being broken. According to the above analysis, the number of through-holes in the bending area can be reduced accordingly, so that the manufacturing process can be further simplified and the costs can be reduced. In other embodiments, the through-holes can be arranged in the medium layer 120 in the bending area 6 such that the two wiring layers are electrically connected in the bending area, and a person skilled in the art can design as needed.

The shape of the wiring layers 202 can be configured according to the force when being bent. According to an embodiment, referring to FIG. 5, the wiring layers 202 include a plurality of hollow areas 202a. In an embodiment, the hollow areas 202a can have a shape of quadrilateral.

The hollow areas 202a form a grid-like structure of the wiring layers 202. Each grid is surrounded by one curve line or by several bending lines, and the adjacent grids are connected through the bending lines or curve. It can be seen in FIG. 5 that each wiring layer 202 having hollow areas 202a has two branches 202b in parallel connection. In this case, in one hand, even if one of the branches 202b has cracks or is broken, the signal can still be transmitted by the other branch 202b. In the other hand, the wiring layer 202 having grid-like structure can further dodge other wirings in the same layer as this wiring layer 202, thus improving the flexibility of wiring of the wiring layers 202 and the utilization of space.

Besides, the wiring layers 202 including the hollow areas 202a can also reduce bending stress of the wiring layers 202 in the bending area 6, enhancing the bending resistance performance of the wiring layers 202.

Figure 5:
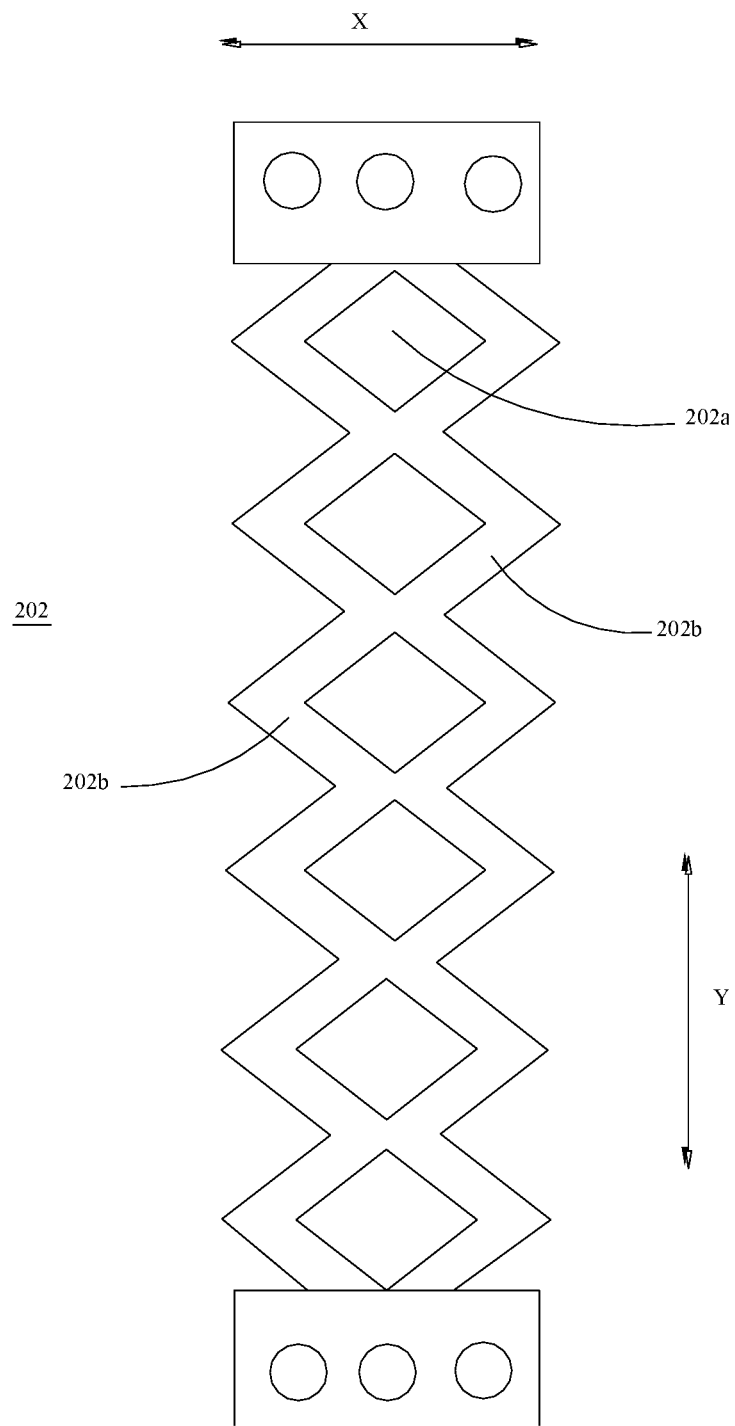
FIG. 5 illustrates a schematic diagram of a wiring layer according to an embodiment of the present disclosure.

In the embodiment as illustrated in FIG. 5, the hollow areas 202a are arranged in bending area 6. In a direction parallel to a bending axis (direction X in FIG. 5), the wiring layer 202 includes only one hollow area 202a. That is, the hollow areas 202a are sequentially arranged only in a direction perpendicular to the bending axis (direction Y in FIG. 5). This configuration can reduce the space occupied by each wiring layer 202, achieving a more impact arrangement of the wiring layers 202.

Figure 6:
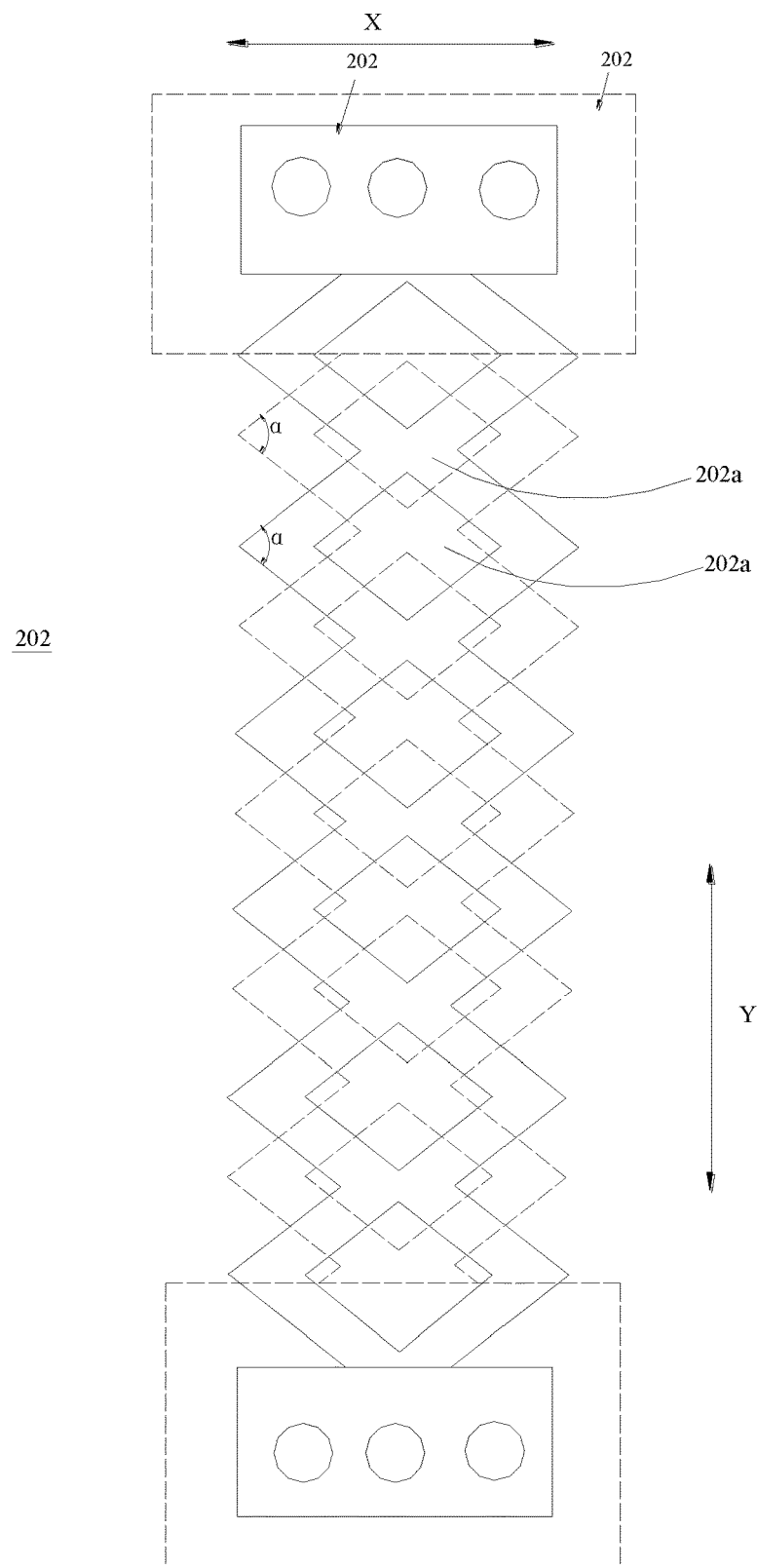
FIG. 6 illustrates a schematic diagram of an arrangement of two wiring layers according to an embodiment of the present disclosure.

FIG. 6 is a schematic diagram of an arrangement of two wiring layers according to an embodiment of the present disclosure.

The two wiring layers 202 shown in FIG. 6 have a same shape, i.e., both of them include hollow areas 202a. It should be understood that the shape of each wiring layer 202 can be different, which is not limited in the present disclosure.

In the embodiment illustrated in FIG. 6, orthographic projections of the hollow areas 202a of one wiring layer 202 on the flexible substrate 10 overlap orthographic projections of the hollow areas 202a of the other wiring layer 202 on the flexible substrate 10. That is, the projections of the two wiring layers 202 are not completely overlapped, but are arranged in a staggering manner in direction Y, the two wiring layers 202 are indicated by solid lines and dashed lines, respectively.

When the flexible display panel 100 is bent, the staggered two wiring layers 202 have different bending positions. When the hollow areas of the wiring layers 202 have a shape of quadrilateral, positions of the angles α of one wiring layer 202 are staggered with respect to positions of the angles α of the other wiring layer 202. Since the positions of the sharp angles are points of stress concentration, the two wiring layers 202 are subjected to different bending stresses. Thus, stress accumulation on upper and lower wiring layers 202 can be distributed, reducing the risk of the wiring layers 202 being broken. Besides, in the present embodiment, the two wiring layers are parallel connected, so that electric resistance of the wiring layers is effectively reduced, thereby reducing power consumption.

Figure 7:
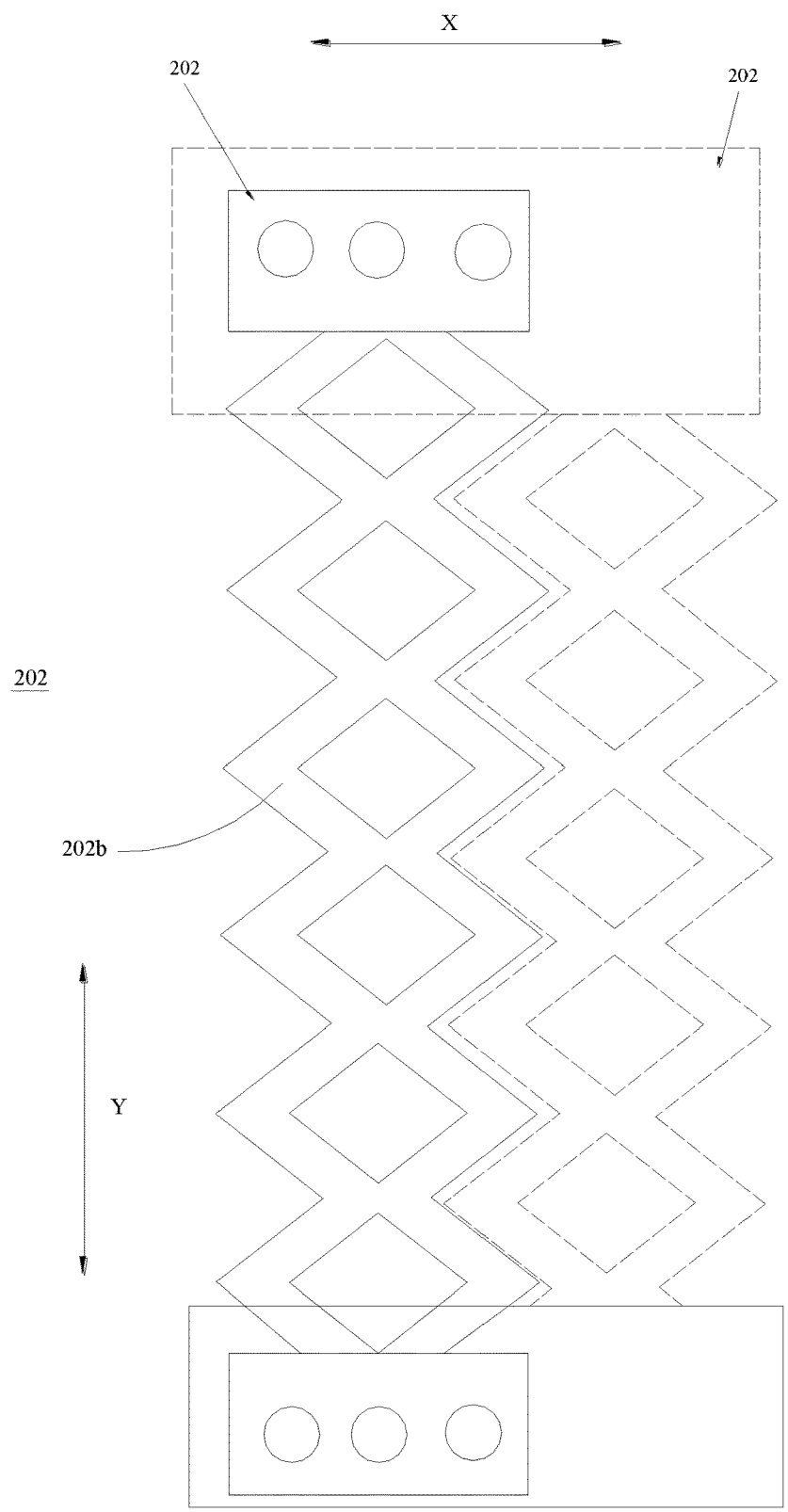
FIG. 7 illustrates a schematic diagram of another arrangement of two wiring layers according to an embodiment of the present disclosure.

FIG. 7 illustrates a schematic diagram of an arrangement of two wiring layers according to an embodiment of the present disclosure.

Orthographic projections of hollow area 202a of one wiring layer 202 on the flexible substrate 10 do not overlap orthographic projections of hollow area 202a of the other wiring layer 202 on the flexible substrate 10. That is, the projections of the two wiring layers 202 are sequentially arranged in direction X, and are staggered in direction Y. The two wiring layers 202 are showed in solid lines and dashed lines, respectively.

When the flexible display panel 100 is bent, the staggered distributed two wiring layers 202 have different bending positions. When the wiring layers 202 have a shape of quadrilateral, positions of the sharp angles of one wiring layer 202 are staggered with respect to positions of the sharp angles of the other wiring layer 202. Since the positions of the sharp angles are points of stress concentration, the two wiring layers 202 are subjected to different bending stresses. Thus, the stress accumulation in the upper and lower wiring layers 202 can be distributed, thereby reducing the risk of the wiring layers 202 being broken. Moreover, the projections of the two wiring layers 202 are sequentially arranged in the X direction, so that only one wiring layer is bent in the thickness direction, and the stress when being bent can be further distributed, thereby further improving the bendability. In addition, since the two wiring layers are arranged in an upper-and-lower manner such that the adjacent signal transmission lines are not short-circuited when being bent, thereby improving the reliability of signal transmission.

In the embodiment illustrated in FIG. 7, each of the two wiring layers 202 is configured to be one strand. In some other embodiments, each of the two wiring layers 202 can be configured to be multiple strands, the multiple strands of each wiring layers are connected in one-to-one correspondence.

In addition, in the above embodiments, the number of through-holes for realizing bridge connections between different wiring layers 202 is not limited. The number of the through-holes can be chosen according to the actual structure and size of each wiring layers 202.

Figure 8:
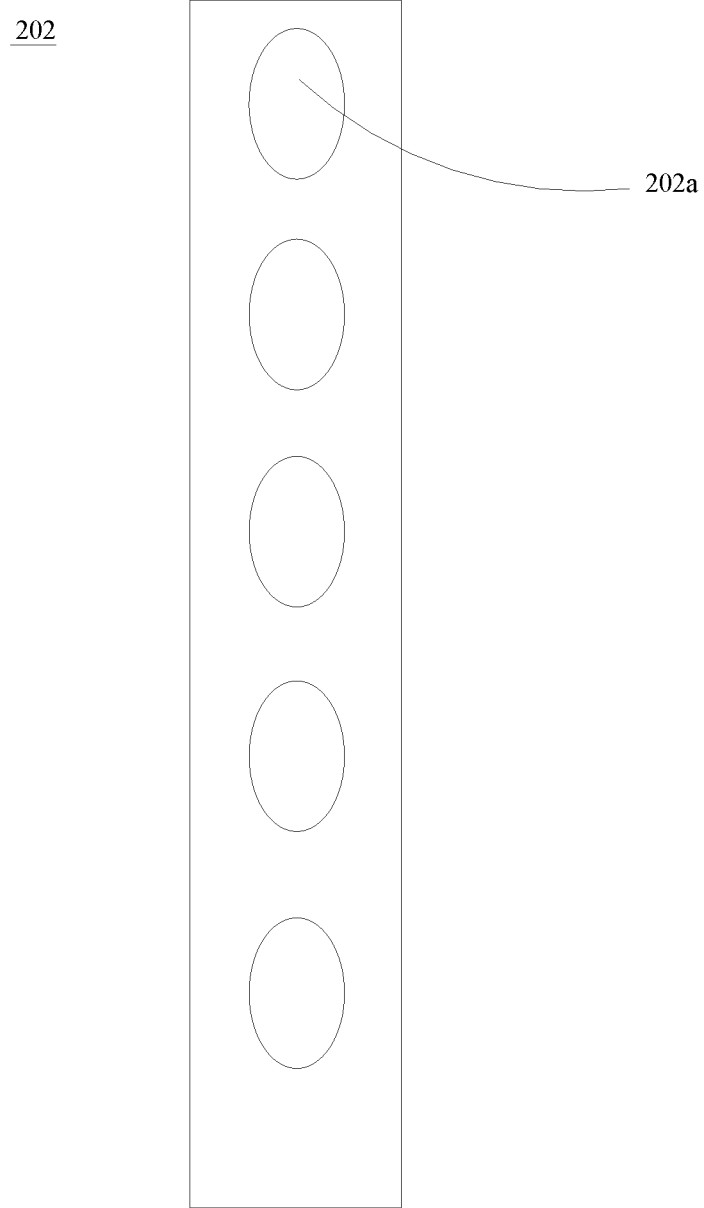
FIG. 8 illustrates a schematic diagram of hollow areas in a wiring layer according to an embodiment of the present disclosure.

In the embodiments illustrated in FIGS. 5 to 7, the shape of each hollow area 202a is a quadrilateral. However, it should be understood that the hollow areas 202a can also have a shape of ellipse, circle or any polygon. FIG. 8 illustrates a schematic diagram of hollow areas having a shape of ellipse.

Figure 9:
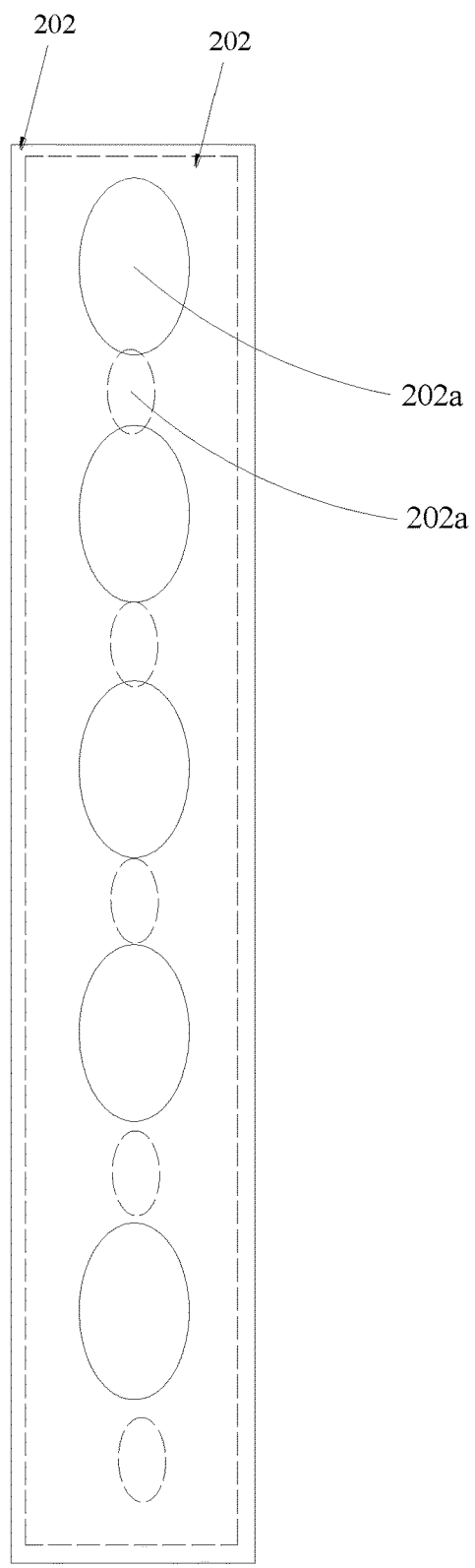
FIG. 9 illustrates a schematic diagram of an arrangement of two wiring layers according to an embodiment of the present disclosure.
Figure 10:
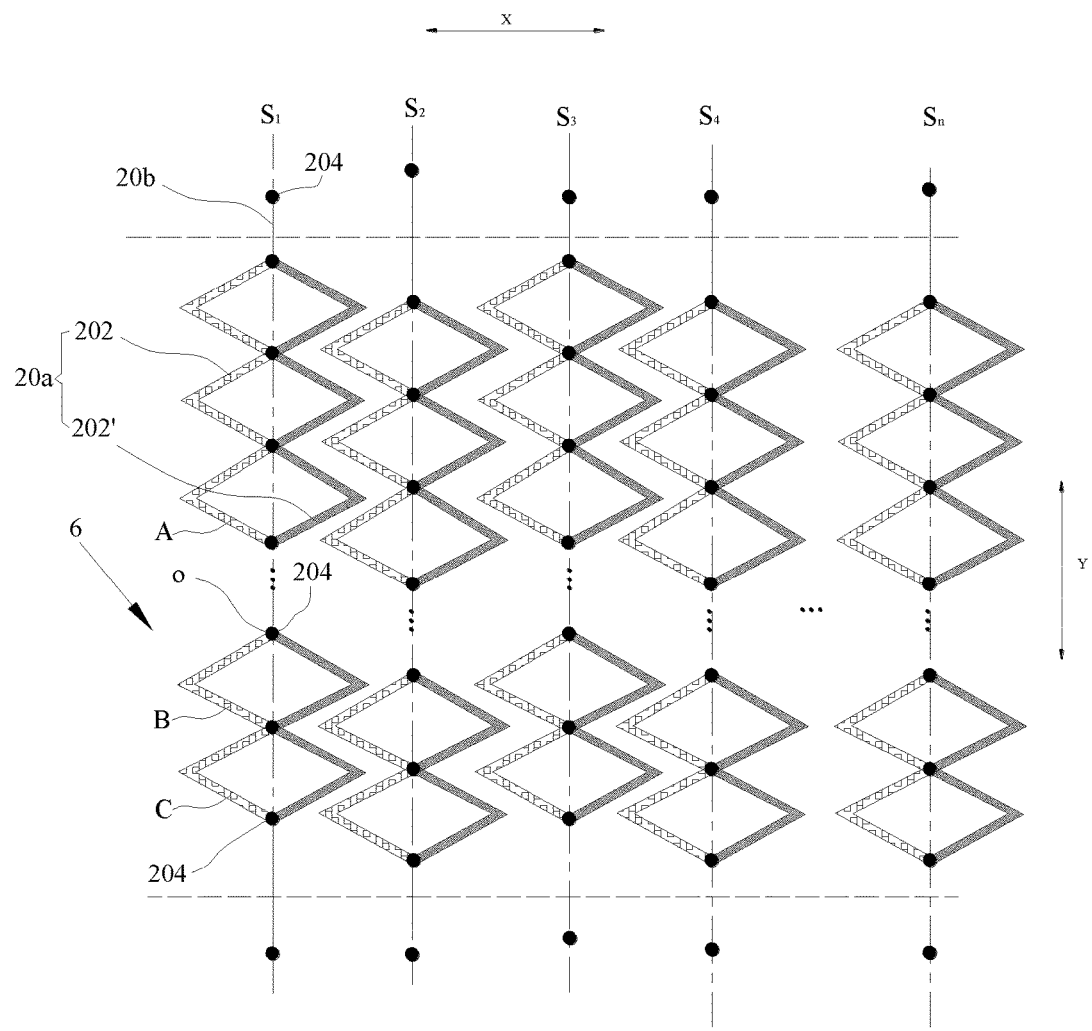
FIG. 10 illustrates a schematic diagram of another arrangement of two wiring layers according to an embodiment of the present disclosure.

In order to distribute the stress accumulation, the hollow areas 202a having a shape of ellipse can be arranged in the staggered manner shown in FIG. 6 or in FIG. 7, which refers to FIG. 9 and will not be described in details herein. FIG. 10 is a schematic diagram of another arrangement of two wiring layer according to an embodiment of the present disclosure.

In an embodiment, in the bending area, the signal transmission line 20 includes two parallel wiring layers. The two parallel wiring layers are electrically connected through a plurality of through-holes in the extension direction of the wiring layers.

FIG. 10 is a schematic diagram of an arrangement of double wiring layers according to another embodiment of the present disclosure. In FIG. 10, $S_1 \ldots S_n$ represent the signal transmission lines 20, one end of each signal transmission line 20 is connected to an AA area, and the other end of each signal transmission line 20 is electrically connected to a driving chip (IC) terminal. Projections of two adjacent signal transmission lines 20 in a direction perpendicular to the flexible substrate 10 are non-overlapped.

Each signal transmission line 20 includes a first wiring portion 20a and a second wiring portion 20b. The first wiring portion 20a is arranged in the bending area 6, and the second wiring portion 20b is arranged in the non-bending area. The first wiring portion 20a includes two parallel wiring layers 202 and 202'. Both of the two wiring layers 202 and 202' are of a bending structure. The two different layers where the first wiring portion 20a is distributed have symmetric projections on the flexible substrate with respect to a straight line where the second wiring portion 20b is located. The projection of one wiring layer 202 on the flexible substrate is located on the left side of the straight line, and the projection of the other wiring layer 202' on the flexible substrate is located on the right side of the straight line. In the embodiment of the present disclosure, the first wiring portion 20a includes two parallel wiring layers 202 and 202'. The two parallel wiring layers are electrically connected through a plurality of through-holes along the extension direction of the wiring layers, so that electric resistance of the wiring layers is effectively reduced, thereby reducing power consumption. Moreover, when short circuit occurs at a certain portion of the wiring layer, the signal can still be transmitted by other portions, thereby improving reliability of signal transmission. In the other hand, the two different layers where the first wiring portion 20a is distributed have symmetric projections on the flexible substrate with respect to a straight line where the second wiring portion 20b is located. That is, in the thickness direction, when being bent, only one wiring layer is bent, so that the bending stress is effectively reduced, thereby improving the bending performance of the wiring layers.

Figure 11:
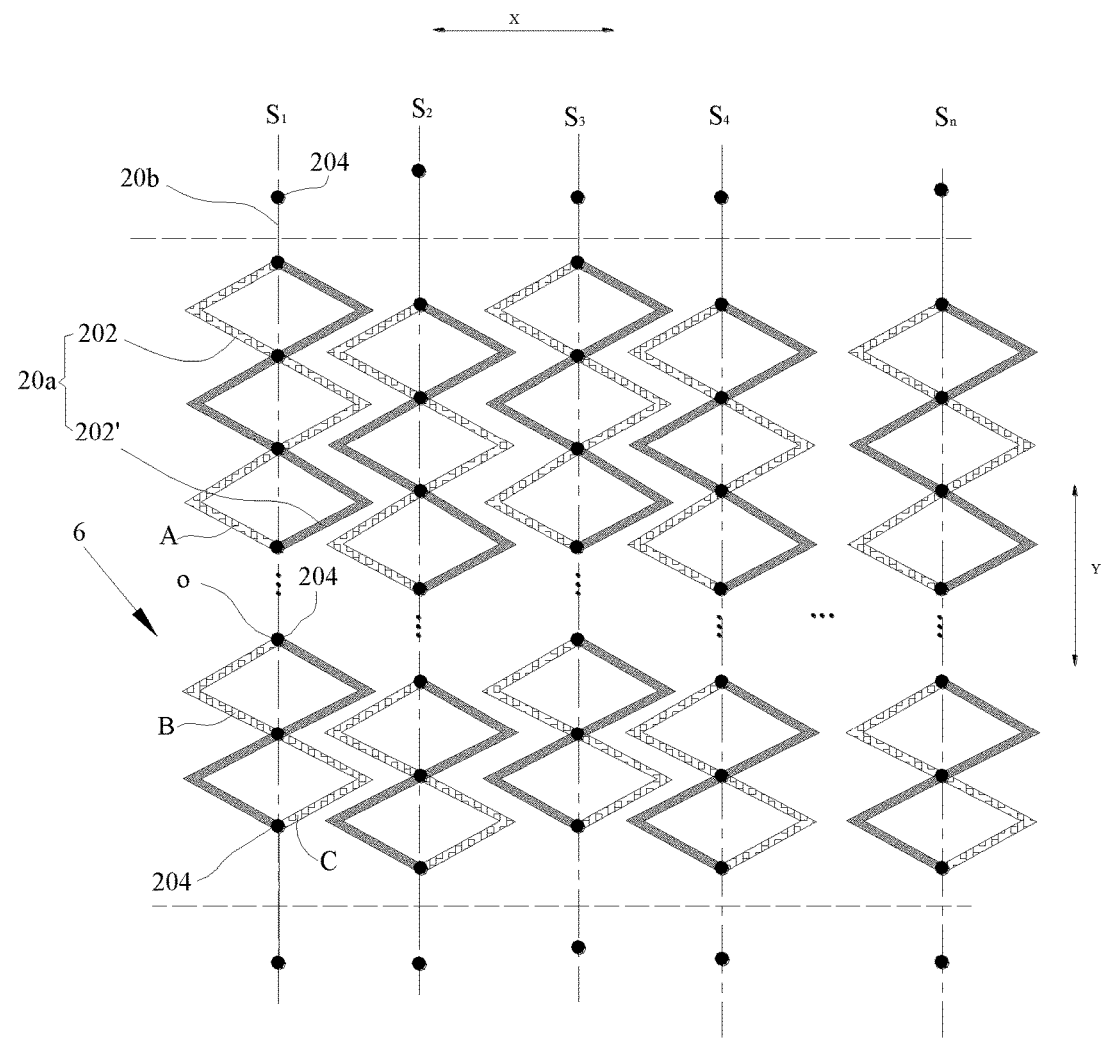
FIG. 11 illustrates a schematic diagram of another arrangement of two wiring layers according to an embodiment of the present disclosure.

FIG. 11 is a schematic diagram of an arrangement of two wiring layers according to another embodiment of the present disclosure. Each signal transmission line 20 includes a first wiring portion 20a and a second wiring portion 20b. The first wiring portion 20a is arranged in the bending area 6, and the second wiring portion 20b is arranged in the non-bending area. The first wiring portion 20a includes two parallel wiring layers 202 and 202'. Each wiring layer 202 or 202' is of a bending structure, and the two different layers where the first wiring portion 20a is distributed have symmetric projections on the flexible substrate with respect to a straight line where the second wiring portion 20b is located. The projections of the wiring layers 202 and 202' on the flexible substrate are located on both sides of the straight line. In the arrangement of the present embodiment, the requirements on graphic accuracy for arranging the wiring layers 202 and 202' can be lowered, thereby reducing the manufacturing difficulty.

Figure 12:
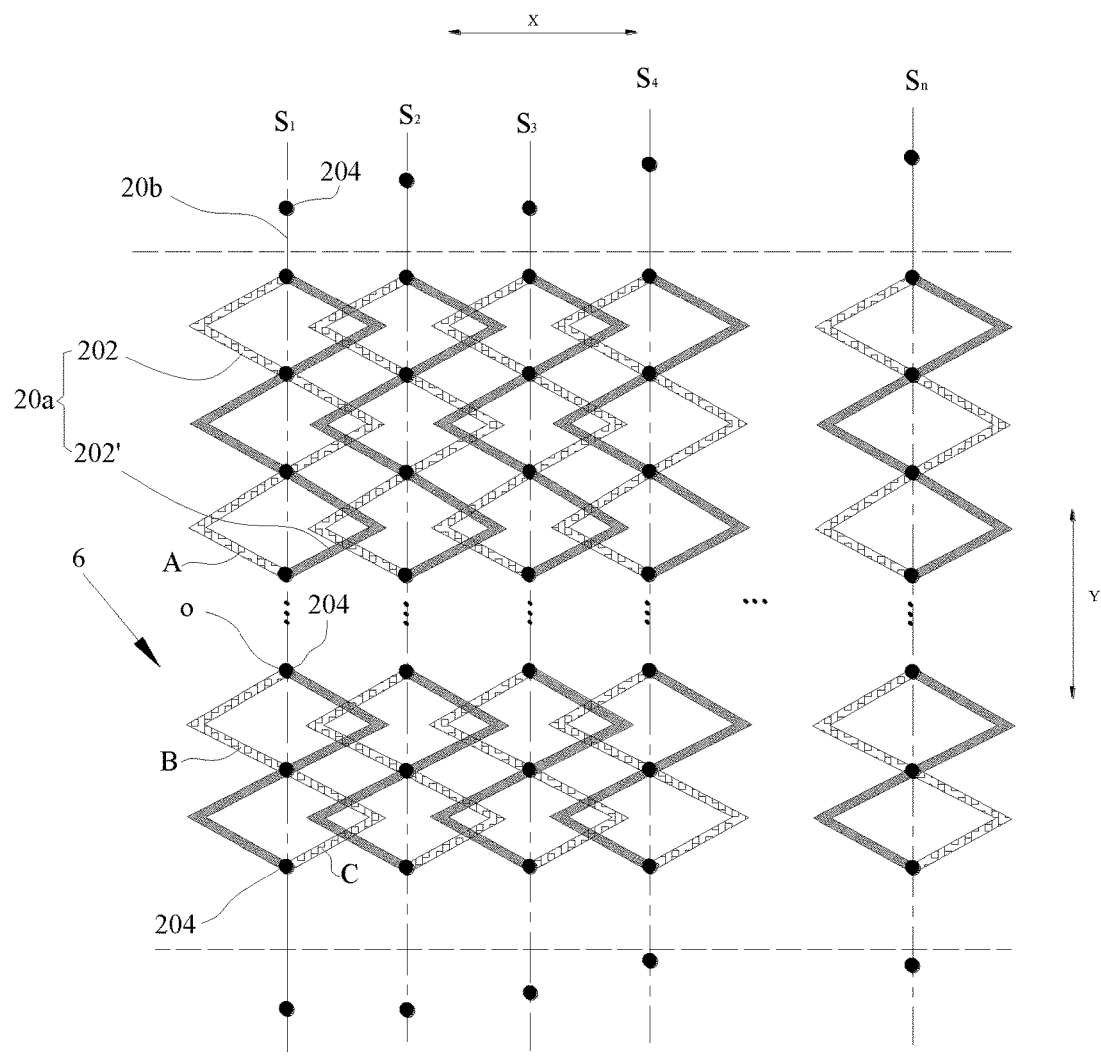
FIG. 12 illustrates a schematic diagram of another arrangement of two wiring layers according to an embodiment of the present disclosure.

FIG. 12 is a schematic diagram of an arrangement of the two wiring layers according to another embodiment of the present disclosure. By moving up the signal transmission lines in even-numbered rows of $S_1 \ldots S_n$ shown in FIG. 10 or FIG. 11, a variant embodiment illustrated in FIG. 12 is obtained. In the embodiment illustrated in FIG. 12, positions of the through-holes 204 and positions of the angles of the wiring layers 202 and 202' can be arrange in a staggered manner. In addition, projection of one wiring layer 202 on the flexible substrate 10 partially overlaps projection of the other wiring layer 202' on the flexible substrate 10. At the overlapping position, an undulation in the direction perpendicular to the flexible substrate 10 occurs on the wiring layers 202 and 202', and the undulant structure can relieve the unequal bending stress in the wiring layers 202 and 202' when being bent. Accordingly, risk of the wiring layers 202 and 202' being broken is reduced. Besides, since the two wiring layers at the overlapping positions are arranged in different layers, interference between adjacent signals is reduced. Moreover, distance between adjacent wirings can be effectively shortened such that more signal transmission lines can be arranged in same area, which is favorable to high solution wiring designs. Furthermore, since the two wiring layers at the overlapping positions are arranged in different layers, the adjacent signal transmission lines are not short-circuited when being bent, thereby improving the reliability of signal transmission.

Figure 13:
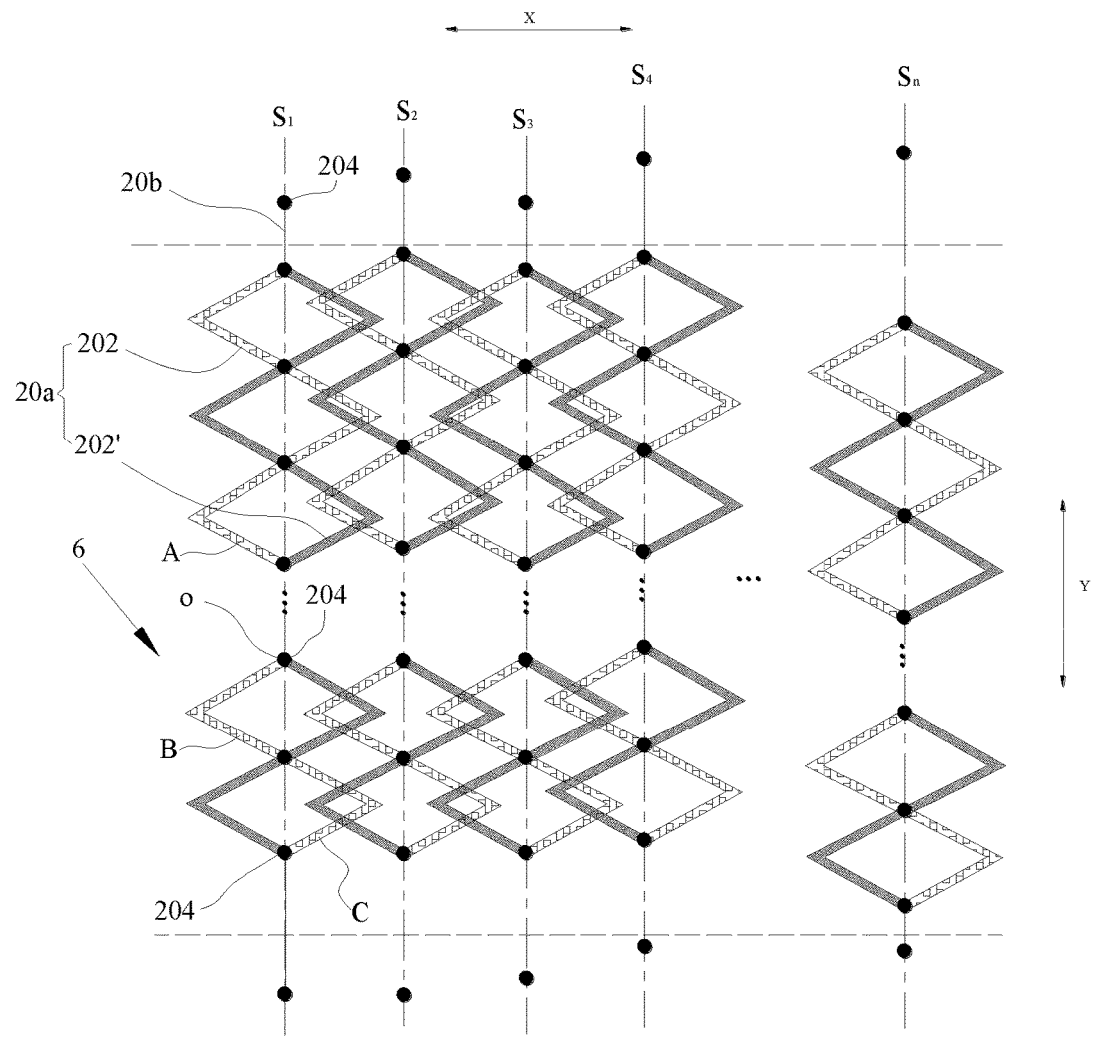
FIG. 13 illustrates a schematic diagram of another arrangement of two wiring layers according to an embodiment of the present disclosure.

FIG. 13 is a schematic diagram of an arrangement of the two wiring layers according to another embodiment of the present disclosure.

By moving up the signal transmission lines in even-numbered row of $S_1 \ldots S_n$ in FIG. 12, a variant embodiment illustrated in FIG. 13 is obtained. In the embodiment illustrated in FIG. 13, positions of the through-holes 204 and positions of the angles of the wiring layers 202 and 202' can be arranged in a staggered manner. Meanwhile, the positions of angles of the wiring layer 202 and the positions of angles of the wiring layer 202' are arranged in the staggered manner. Based on the above embodiment, the staggered arrangement of the angles of the wiring layers 202 and 202' can further alleviate the stress concentration when being bent, and the risk of the wiring layers 202 and 202' being broken is further reduced.

In the embodiments illustrated in FIGS. 10 to 13, the two wiring layers of the first wiring portion 20a are connected through a plurality of through-holes 204. The plurality of through-holes is sequentially arranged along a symmetry axis of the two wiring layers of the first wiring portions 20a. The plurality of through-holes results in that the two wiring layers of the first wiring portion 20a form a plurality of connection positions o in an interval. By such arrangement, even if the first wiring portion 20a is broken at one section (for example, section A), other sections (for example, section B or section C and so on) of the first wiring portion 20a can be used as signal transmission line 20 to transmit signals due to the presence of the through-holes 204, thereby improving the bending resistance performance of the signal transmission lines 20 and the reliability of signal transmission.

In another aspect, in the embodiments as described above, in the case where the first wiring portions 20a are configured to have a same length, the first wiring portions 20a having a bending structure can occupy smaller space, allowing optimization of the arrangement of the wiring layers 202.

In the embodiments illustrated in FIGS. 10 to 13, projections of the two wiring layers 202 and 202' in the direction perpendicular to the flexible substrate 10 form a shape of quadrilateral, circle or ellipse.

It should be noted that, in the embodiments shown in FIGS. 10 to 13, the number of through-holes 204 are not limited to the cases shown above. For example, the number of the through-holes 204 can be reduced, and those skilled in the art adjust according to their needs.

It also should be noted that in the embodiments as described in FIGS. 10 to 13, the through-holes can not only be arranged in the bending area 6, but also can be arranged in the non-bending area at the same time. In the non-bending area, one of the two wiring layers 202 and 202' is connected to other parts of the signal transmission line 20 through the through-hole 204.

In an optional embodiment, the quadrilateral projection of two wiring layers can be configured to be symmetric with respect to a first straight line, and an extension direction of the first straight line is a direction perpendicular to the bending axis (direction Y shown in FIG. 10).

In another optional embodiment, the quadrilateral projection of two wiring layers can also be arranged in a staggered manner in a first direction (direction Y shown in FIG. 10), and the first direction is a direction perpendicular to the bending axis. The quadrilaterals arranged in staggered manner are more beneficial to alleviating the bending stress. The reason is in that, the sharp angles of the quadrilaterals tends to form stress concentration points when being bent, while the sharp angles of the quadrilaterals are staggered to one another and thus the stress concentration points are staggered to one another by arranging the quadrilaterals in the staggered manner in the first direction.

The plurality of signal transmission lines $S_1 \ldots S_n$ can also include at least one of a data signal transmission line, a touch signal transmission line and a power signal line. That is, all of the data signal transmission line, the touch signal transmission line and the power signal line can include a structure of a plurality of parallel wiring layers, in order to lower the risk of each signal transmission line 20 being broken.

Besides, the parallel wiring layers included in the data signal transmission line can also have hollow areas, and the hollow areas can have a shape of quadrilateral, circle or ellipse.

The touch signal transmission line and the power signal line can be arranged according to the data signal transmission line, which will not be described herein.

It should be noted that, the power signal line can include a plurality of (more than two) parallel wiring layers, which can further reduce the electrical resistance of the power signal line.

In an embodiment, projections of the parallel wiring layers used as a power signal line on the flexible substrate 10 can be arranged in a non-overlapping manner as shown in FIG. 7, and the technical effects are substantially same as those of the technical solution, which will not be described herein.

Figure 14:
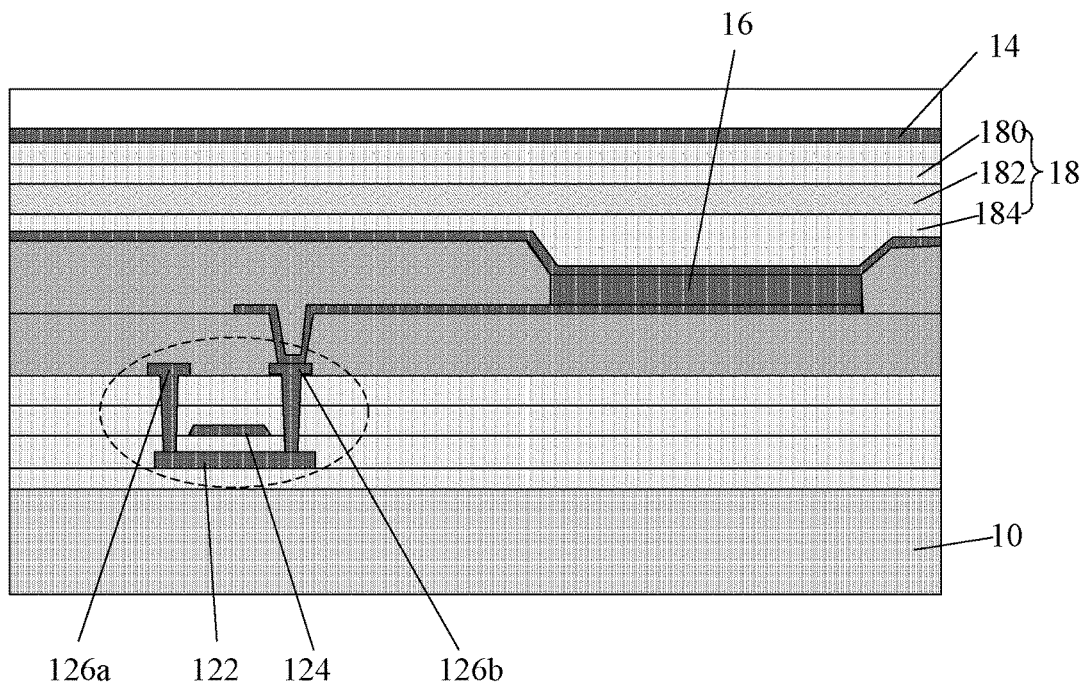
FIG. 14 illustrates a cross-sectional view of a flexible display panel according to an embodiment of the present disclosure.

FIG. 14 shows a cross-sectional view of a flexible display panel.

The flexible display panel 100 provided in the present disclosure can be an inorganic light-emitting display panel. Further, an organic light-emitting element layer 16 can be included between the thin film transistor layer 12 and the touch layer 14, and the organic light-emitting element layer 16 is used as a light source which can emit lights of different colors.

Further, a thin film encapsulation layer 18 can be included on one side of the organic light-emitting element layer 16 away from the flexible substrate 10. The thin film encapsulation layer 18 covers the display area of the flexible display panel 100. The thin film encapsulation layer 18 can encapsulate the thin film transistor layer 12, the organic light-emitting element layer 16 and the like, so as to prevent them from water and oxygen.

The thin film encapsulation layer 18 can include an organic encapsulation layer and an inorganic encapsulation layer. The number of the organic encapsulation layer or the inorganic encapsulation layer is not limited.

In an optional embodiment, the thin film encapsulation layer 18 includes an inorganic encapsulation layer 180, an organic encapsulation layer 182 and an inorganic encapsulation layer 184 arranged in a stacked manner. The organic encapsulation layer 182 is arranged between the inorganic encapsulation layer 180 and the inorganic encapsulation layer 184.

With respect to the touch layer 14, in an embodiment, the touch layer 14 can be arranged on one side of the thin film encapsulation layer 18 away from the flexible substrate 10.

In another embodiment, at least one of the first touch metal layer and the second touch metal layer is arranged in the thin film encapsulation layer 18. In this embodiment, the first touch metal layer or the second touch metal layer can be integrated into the thin film encapsulation layer 18 without a separate touch panel, which is advantageous to make a thinner and lighter flexible display panel 100.

Figure 15:
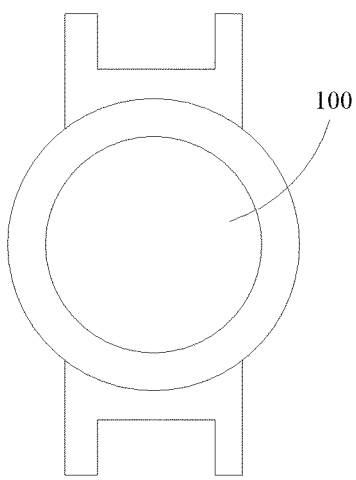
FIG. 15 illustrates a schematic diagram of a flexible display device according to an embodiment of the present disclosure.

The present disclosure further provides a flexible display device 200. FIG. 15 shows a schematic diagram of a flexible display device 200 according to an embodiment of the present disclosure, and the flexible display device 200 includes the flexible display panel 100 described in any of the above embodiments. It should be noted that the flexible display device 200 can be mobile phone, tablet computer or wearable device, and the like.

The above are merely preferred embodiments of the present disclosure, which are not used to limit the present disclosure. Those skilled in the art can make any modification or variation. Within the principles of the present disclosure, any modification, equivalent substitution, improvement shall fall into the protection scope of the present disclosure.

What is claimed is:

1. A flexible display panel having a display area, a non-display area, and a bending area arranged between the display area and the non-display area,
wherein the flexible display panel comprises:
a flexible substrate;
a thin film transistor layer arranged on the flexible substrate, wherein the thin film transistor layer comprises a semi-conductor layer, a gate electrode insulation layer, a gate electrode layer, an insulation interlayer and a source-drain electrode metal layer stacked in a direction away from the flexible substrate;
a touch layer arranged on one side of the thin film transistor layer away from the flexible substrate, wherein the touch layer comprises a first touch metal layer and a second touch metal layer; and
signal transmission lines, comprising two parallel wiring layers, one of the two parallel wiring layers and the source-drain electrode metal layer are fabricated in a same layer, and the other one of the two parallel wiring layers is fabricated in a same layer with the first touch metal layer or the second touch metal layer,
wherein two ends of each of the two parallel wiring layers arranged outside the bending area are connected through a through-hole, and
each of the two wiring layers comprises a plurality of hollow areas, and a shape of one hollow area of the plurality of hollow areas is quadrilateral, circle, ellipse, or polygon.

2. The flexible display panel according to claim 1, wherein one of the two parallel wiring layers comprises the plurality of hollow areas in a direction parallel to a bending axis of the bending area, the plurality of hollow areas is arranged along a first direction, and the first direction is a direction perpendicular to the bending axis.

3. The flexible display panel according to claim 2, wherein projections of the plurality of hollow areas of one of the two parallel wiring layers on the flexible substrate partially overlap with projections of the plurality of hollow areas of the other one of the two parallel wiring layers on the flexible substrate.

4. The flexible display panel according to claim 2, wherein projections of the plurality of hollow areas of the two parallel wiring layers on the flexible substrate do not overlap projections of the plurality of hollow areas of the other one of the two parallel wiring layers on the flexible substrate.

5. The flexible display panel according to claim 1, wherein an organic light-emitting element layer is arranged between the thin film transistor layer and the touch layer, a thin film encapsulation layer is provided on a side of the organic light-emitting element layer away from the flexible substrate, and the thin film encapsulation layer comprises an organic encapsulation layer and at least one inorganic encapsulation layer.

6. The flexible display panel according to claim 5, wherein the touch layer is arranged on a side of the thin film encapsulation layer away from the flexible substrate.

7. A flexible display panel having a display area, a non-display area, and a bending area arranged between the display area and the non-display area,
wherein the flexible display panel comprises:
a flexible substrate;
a thin film transistor layer arranged on the flexible substrate, wherein the thin film transistor layer comprises a semi-conductor layer, a gate electrode insulation layer, a gate electrode layer, an insulation interlayer and a source-drain electrode metal layer stacked in a direction away from the flexible substrate;
a touch layer arranged on one side of the thin film transistor layer away from the flexible substrate, wherein the touch layer comprises a first touch metal layer and a second touch metal layer; and
signal transmission lines, comprising,
two parallel wiring layers in the bending area, each of the two parallel wiring layers is fabricated in a same layer with at least one of the source-drain electrode metal layer, the first touch metal layer, and the second touch metal layer,
wherein in an extension direction of the two parallel wiring layers, the two parallel wiring layers are electrically connected through a plurality of through-holes, and
projections of the two parallel wiring layers in a direction perpendicular to the flexible substrate form shapes of quadrilateral, circle or ellipse.

8. The flexible display panel according to claim 7, wherein projections of adjacent signal transmission lines in the direction perpendicular to the flexible substrate do not overlap with each other.

9. The flexible display panel according to claim 8, wherein the projections having shapes of quadrilateral are arranged in a staggered manner in a first direction, and the first direction is a direction perpendicular to a bending axis of the bending area.

10. The flexible display panel according to claim 8, wherein the projections having shapes of quadrilateral are symmetric with respect to a first straight line, and an extending direction of the first straight line is a direction perpendicular to a bending axis of the bending area.

11. The flexible display panel according to claim 7, wherein an organic light-emitting element layer is arranged between the thin film transistor layer and the touch layer, a thin film encapsulation layer is provided on a side of the organic light-emitting element layer away from the flexible substrate, and the thin film encapsulation layer comprises an organic encapsulation layer and at least one inorganic encapsulation layer.

12. The flexible display panel according to claim 11, wherein the touch layer is arranged on a side of the thin film encapsulation layer away from the flexible substrate.

13. A flexible display panel having a display area, a non-display area, and a bending area arranged between the display area and the non-display area,
wherein the flexible display panel comprises:
a flexible substrate;
a thin film transistor layer arranged on the flexible substrate, wherein the thin film transistor layer comprises a semi-conductor layer, a gate electrode insulation layer, a gate electrode layer, an insulation interlayer and a source-drain electrode metal layer stacked in a direction away from the flexible substrate;
a touch layer arranged on one side of the thin film transistor layer away from the flexible substrate, wherein the touch layer comprises a first touch metal layer and a second touch metal layer; and
signal transmission lines, comprising at least two parallel wiring layers in the bending area, wherein each of the at least two parallel wiring layers is fabricated in a same layer with at least one of the source-drain electrode metal layer, the first touch metal layer, and the second touch metal layer, wherein the signal transmission lines comprise at least one of a data signal transmission line, a touch signal transmission line, and a power signal line, the power signal line comprises at least three parallel wiring layers.

14. The flexible display panel according to claim 13, wherein projections of the at least three parallel wiring layers on the flexible substrate do not overlap with each other.

15. The flexible display panel according to claim 14, wherein each of the at least two parallel wiring layers comprises a plurality of hollow areas, and a shape of one of the plurality of hollow areas is quadrilateral, circle or ellipse.

16. The flexible display panel according to claim 15, wherein the signal transmission lines comprise the power signal line.

17. The flexible display panel according to claim 13, wherein an organic light-emitting element layer is arranged between the thin film transistor layer and the touch layer, a thin film encapsulation layer is provided on a side of the organic light-emitting element layer away from the flexible substrate, and the thin film encapsulation layer comprises an organic encapsulation layer and at least one inorganic encapsulation layer.

18. The flexible display panel according to claim 17, wherein the touch layer is arranged on a side of the thin film encapsulation layer away from the flexible substrate.

* * * * *